United States Patent
Sonoda et al.

(10) Patent No.: US 10,593,872 B2
(45) Date of Patent: Mar. 17, 2020

(54) METHOD OF MANUFACTURING SEMICONDUCTOR MEMORY DEVICE

(71) Applicants: TOSHIBA MEMORY CORPORATION, Minato-ku, Tokyo (JP); SK HYNIX INC., Icheon-si, Gyeonggi-do (KR)

(72) Inventors: Yasuyuki Sonoda, Seoul (KR); Bo Kyoung Jung, Icheon-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/123,235

(22) Filed: Sep. 6, 2018

(65) Prior Publication Data

US 2019/0288188 A1 Sep. 19, 2019

(30) Foreign Application Priority Data

Mar. 15, 2018 (JP) .................. 2018-048215

(51) Int. Cl.
| | |
|---|---|
| *H01L 21/00* | (2006.01) |
| *H01L 43/12* | (2006.01) |
| *H01L 27/22* | (2006.01) |
| *H01L 43/10* | (2006.01) |
| *G11C 11/16* | (2006.01) |
| *H01L 43/08* | (2006.01) |

(52) U.S. Cl.
CPC .......... *H01L 43/12* (2013.01); *G11C 11/1655* (2013.01); *G11C 11/1657* (2013.01); *G11C 11/1659* (2013.01); *G11C 11/1675* (2013.01); *H01L 27/226* (2013.01); *H01L 43/08* (2013.01); *H01L 43/10* (2013.01)

(58) Field of Classification Search
CPC ......... H01L 43/12; H01L 43/08; H01L 43/10; H01L 27/226; G11C 11/1655; G11C 11/1659; G11C 11/1657; G11C 11/1675
USPC .............................................................. 438/3
See application file for complete search history.

(56) References Cited

U.S. PATENT DOCUMENTS

| | | | |
|---|---|---|---|
| 6,602,428 B2 | 8/2003 | Wado et al. | |
| 7,231,705 B2 | 6/2007 | Kagami et al. | |
| 7,473,597 B2 * | 1/2009 | Lee | H01L 21/76877 257/E21.257 |
| 8,083,962 B2 * | 12/2011 | Lee | H01L 21/0337 216/17 |
| 2012/0231603 A1 * | 9/2012 | Im | H01L 45/06 438/382 |
| 2016/0035584 A1 | 2/2016 | Hara et al. | |
| 2016/0336509 A1 * | 11/2016 | Jeong | H01L 43/12 |
| 2016/0380028 A1 | 12/2016 | Sonoda et al. | |

FOREIGN PATENT DOCUMENTS

| | | |
|---|---|---|
| JP | H04373127 A | 12/1992 |
| JP | 2004014705 A | 1/2004 |

* cited by examiner

*Primary Examiner* — Vu A Vu
(74) *Attorney, Agent, or Firm* — Holtz, Holtz & Volek PC

(57) ABSTRACT

According to one embodiment, an insulating layer is formed on a substrate. A hole is formed in the insulating layer. A metal layer is formed in the hole to fill the hole. A surface of the insulating layer and a surface of the metal layer is removed by etching with ion beams having a first angle, which etches both the insulating layer and the metal layer at a first etching rate. A resistance change element is formed on the metal layer.

6 Claims, 14 Drawing Sheets

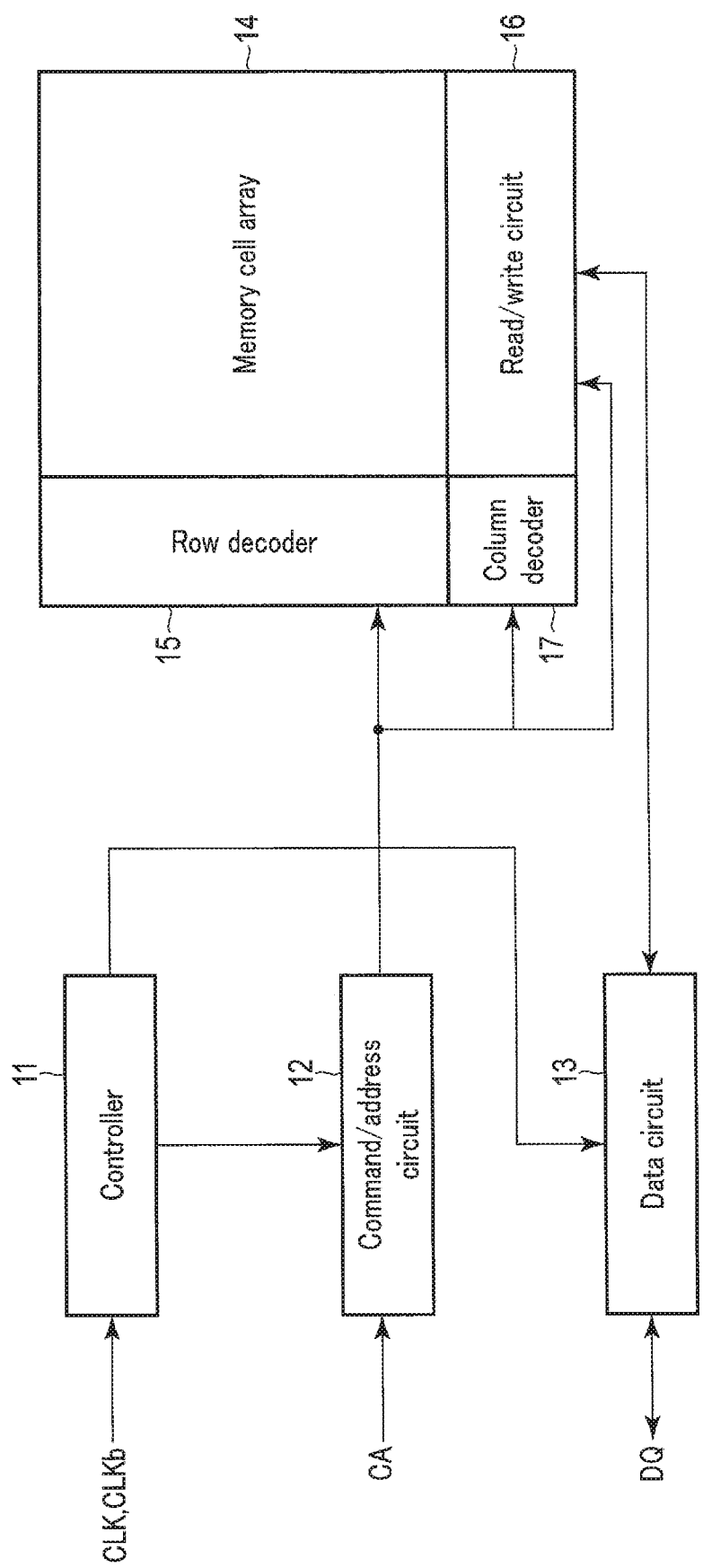
F I G. 1

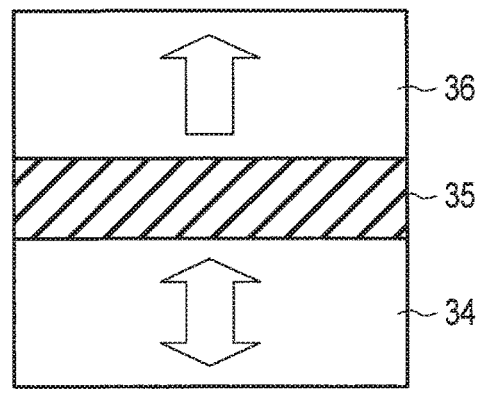
FIG. 4A
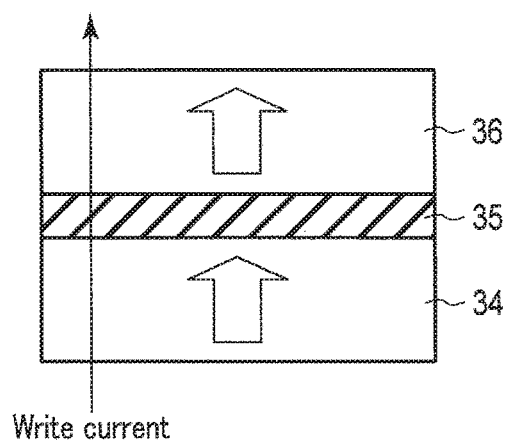
FIG. 4B  Parallel state (low resistance)
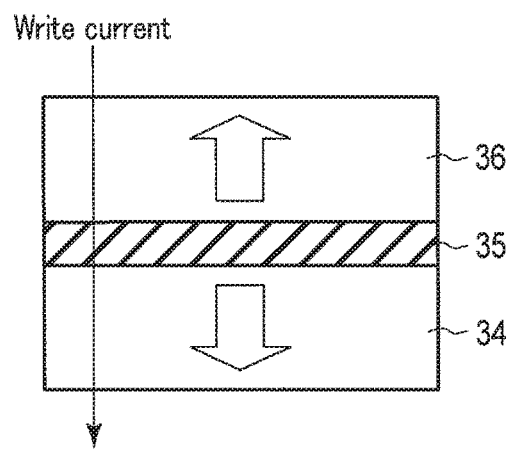
FIG. 4C  Antiparallel state (high resistance)

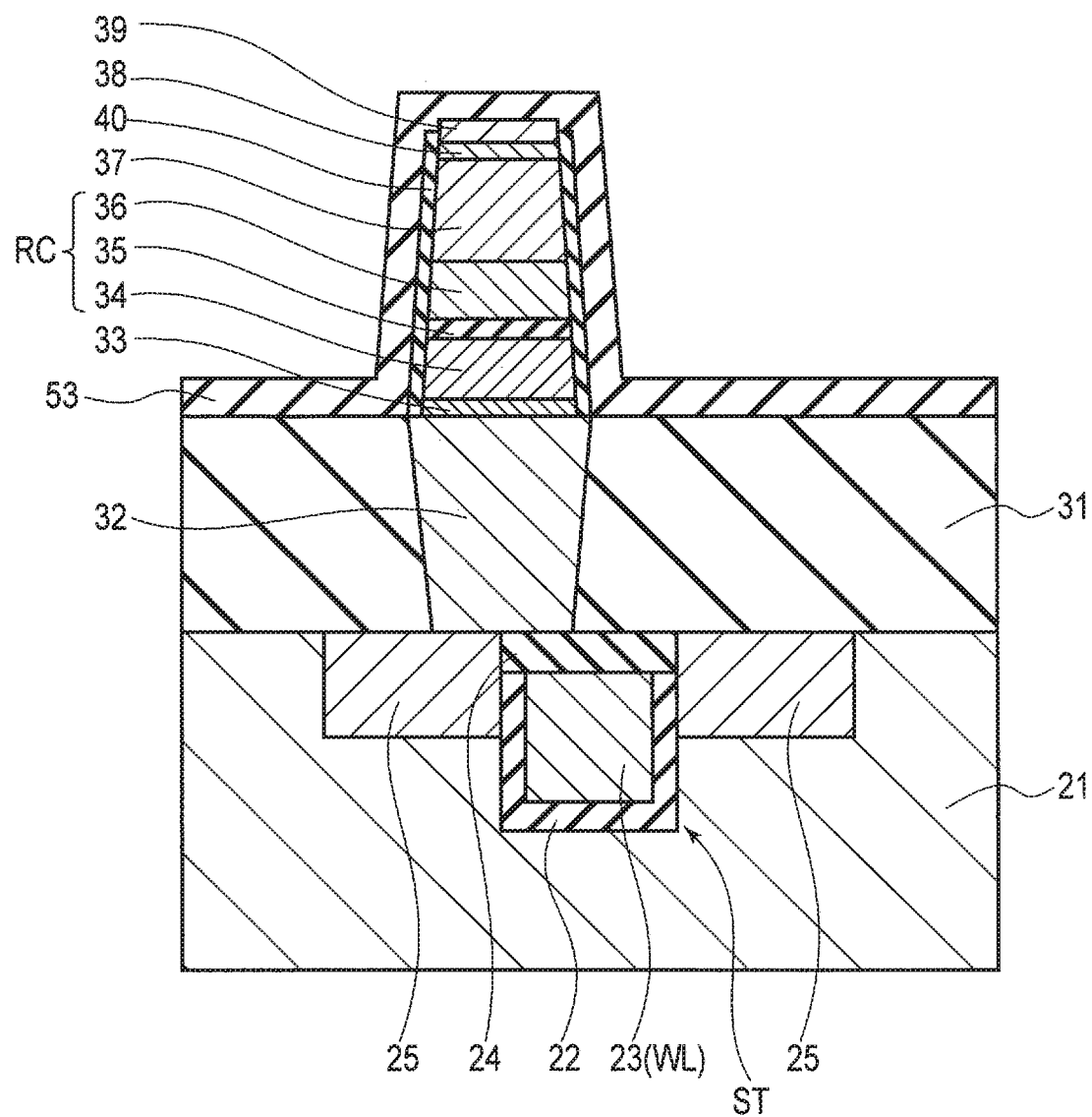
F I G. 13

METHOD OF MANUFACTURING SEMICONDUCTOR MEMORY DEVICE

CROSS-REFERENCE TO RELATED APPLICATIONS

This application is based upon and claims the benefit of priority from Japanese Patent Application No. 2018-48215, filed Mar. 15, 2018, the entire contents of which are incorporated herein by reference.

FIELD

Embodiments described herein relate generally to a method of manufacturing a semiconductor memory device.

BACKGROUND

A magnetic random access memory (MRAM) is a memory device that includes memory elements having a magnetoresistive effect as memory cells for storing information. MRAMs have attracted attention as a next generation memory device characterized by high-speed operation, large capacity, and non-volatility.

BRIEF DESCRIPTION OF THE DRAWINGS

FIG. 1 is a block diagram of an overall configuration of a semiconductor memory device according to an embodiment;

FIG. 4A is a cross-sectional view of a resistance change element in the semiconductor memory device according to the embodiment;

FIG. 4B is a cross-sectional view for explaining writing of the resistance change element in the semiconductor memory device according to the embodiment where the resistance change element is in a parallel state (P state);

FIG. 4C is a cross-sectional view for explaining writing of the resistance change element in the semiconductor memory device according to the embodiment where the resistance change element is in an antiparallel state (AP state);

FIG. 13 is a cross-sectional view illustrating the manufacturing process of the memory cell of the semiconductor memory device according to the embodiment;

DETAILED DESCRIPTION

Figure 2:
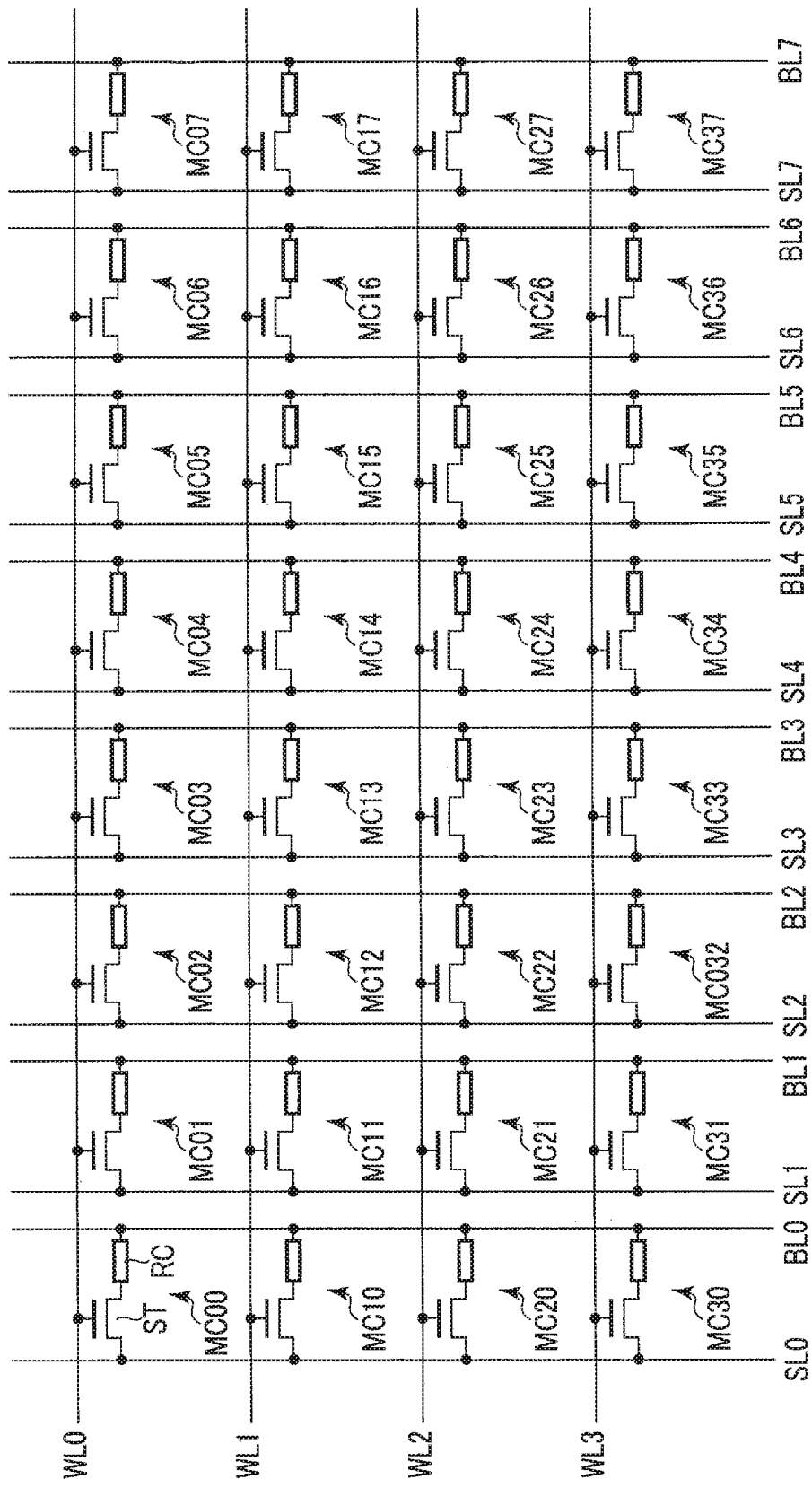
FIG. 2 is a view of a memory cell array of the semiconductor memory device according to the embodiment.

According to one embodiment, an insulating layer is formed on a substrate. A hole is formed in the insulating layer. A metal layer is formed in the hole to fill the hole. A surface of the insulating layer and a surface of the metal layer is removed by etching with ion beams having a first angle, which etches both the insulating layer and the metal layer at a first etching rate. A resistance change element is formed on the metal layer.

Embodiments will hereinafter be described with reference to the drawings. In the drawings, the same components are denoted by the same reference numerals.

Embodiment

Hereinafter, a semiconductor memory device according to an embodiment will be described with reference to FIGS. 1 to 15. An MRAM that stores data with a magnetoresistive effect element (magnetic tunnel junction (MTJ) element) as a resistance change element will be illustrated herein, but the present embodiment is not limited thereto. This embodiment is generally applicable to memories, both volatile memories and nonvolatile memories, configured to convert a resistance difference of a resistance change element into a current difference or a voltage difference as to sense the difference. This embodiment is also applicable to a semiconductor memory device including an element that stores data utilizing a resistance change as in a resistance change memory, similar to an MRAM, such as ReRAM and PCRAM.

In the following description, the term "couple" includes not only "to couple directly" but also "to couple through any elements" unless otherwise specified. Furthermore, a first terminal of a transistor represents one of a source or a drain, and a second terminal of the transistor represents the other of the source or the drain. A control terminal of the transistor represents a gate.

Exemplary Configuration According to Embodiment

FIG. 1 is a block diagram of an overall configuration of the semiconductor memory device according to the embodiment.

As illustrated in FIG. 1, the semiconductor memory device includes a controller 11, a command/address circuit 12, a data circuit 13, a memory cell array 14, a row decoder 15, a read/write circuit 16, and a column decoder 17.

The controller 11 receives clock signals CLK and CLKb and an external control signal from the outside (a host device). The controller 11 includes components such as a voltage generating circuit and is configured to control the command/address circuit 12 and the data circuit 13 based on the external control signal.

The command/address circuit 12 receives a command/address signal CA from the outside and is configured to supply signals based on the command/address signal CA to the row decoder 15, the read/write circuit 16, and the column decoder 17.

The data circuit 13 transmits and receives data DQ to and from the outside and the read/write circuit 16. More specifically, the data circuit 13 transfers write data from the outside to the read/write circuit 16. In addition, the data circuit 13 transfers read data from the read/write circuit 16 to the outside.

The row decoder 15 selects a word line WL in accordance with a row address from the command/address circuit 12.

The column decoder 17 selects a bit line BL and a source line SL in accordance with a column address from the command/address circuit 12.

The read/write circuit 16 includes a sense amplifier and the like and is configured to control writing and reading with respect to the memory cell array 14.

FIG. 2 is a view of the memory cell array 14 of the semiconductor memory device according to the embodiment.

As illustrated in FIG. 2, bit lines BL (BL0 to BL7), source lines Sr (SL0 to SL7), and word lines WL (WL0 to WL3) are, provided in the memory cell array 14. The bit lines BL and the source lines SL extend in a first direction, being provided alternately in a second direction perpendicular to the first direction. The word lines WL extend in the second direction. The memory cell array 14 includes memory cells MC (MC00 to MC07, MC10 to MC17, MC20 to MC27, and MC30 to MC37). Each memory cell MC is provided at an intersection between a bit line BL and a source line SL and a word line WL. Therefore, the memory cells MC are arranged in a matrix in the first direction and the second direction.

More specifically, the memory cells MC00 to MC07 are provided at intersections between the bit lines BL0 to BL7 and the source lines SL0 to SL7 and the word line WL0. The memory cells MC10 to MC17 are provided at intersections between the bit lines BL0 to BL7 and the source lines SL0 to SL7 and the word line WL1. The memory cells MC 20 to MC 27 are provided at intersections between the bit lines BL0 to BL7 and the source lines SL0 to SL7 and the word line WL2. The memory cells MC30 to MC37 are provided at intersections between the bit lines BL0 to BL7 and the source lines SL0 to SL7 and the word line WL3. The memory cells MC are electrically coupled to the bit lines BL, the source lines SL, and the word lines WL at the intersections.

It should be noted the number of the bit lines BL, the source lines SL, and the word lines WL of the memory cell array 14 herein is for purposes of illustration and not limitation.

Each memory cell MC includes, for example, a resistance change element RC and a select transistor ST. A first terminal of the resistance change element RC is electrically coupled to a bit line BL, and a second terminal thereof is electrically coupled to a first terminal of a select transistor ST. A second terminal of the select transistor ST is electrically coupled to a source line SL, and a control terminal of the select transistor ST is electrically coupled to a word line WL.

The resistance change elements RC change resistance by application of a current (or a voltage). Each resistance change element RC includes, for example, an MTJ element, a phase change element, or a ferroelectric element. Each memory cell MC is selected as the select transistor ST is turned on by the word line WL. Herein described is a case where an MRAM, that is, the resistance change element RC serves as an MTJ element.

Figure 3:
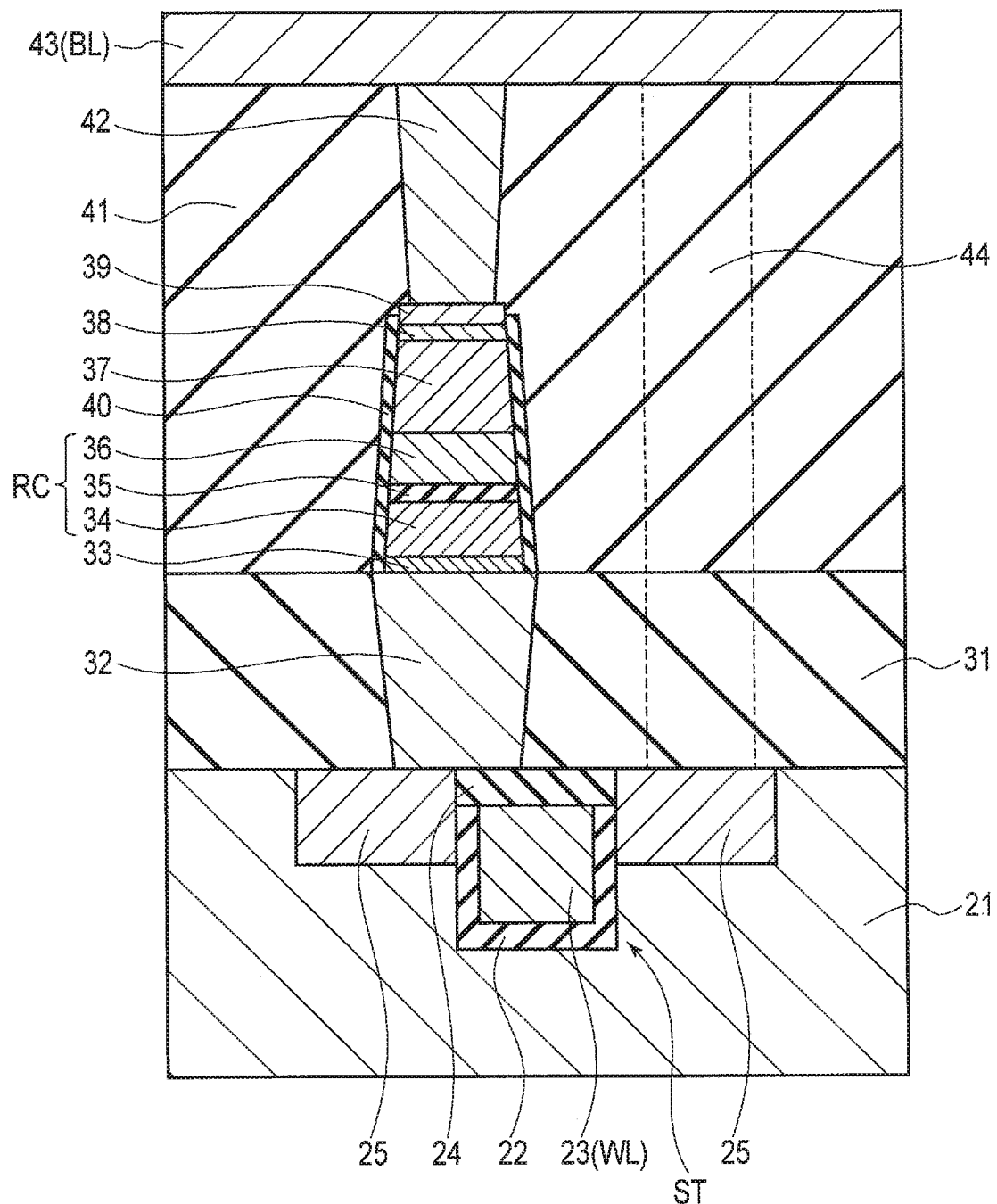
FIG. 3 is a cross-sectional view of a memory cell of the semiconductor memory device according to the embodiment.

FIG. 3 is a cross-sectional view of the memory cell MC of the semiconductor memory device according to the embodiment.

Hereinafter, for convenience sake, a direction in a stacking direction (vertical direction in FIG. 3) from the semiconductor substrate 21 to the resistance change element. RC is referred to as "upper side", and a direction from the resistance change element RC to the semiconductor substrate 21 is referred to as "lower side", but this notation is for the purpose of convenience and is irrelevant to the direction of gravity.

As illustrated in FIG. 3, the memory cell MC of the semiconductor memory device includes the select transistor ST, a lower electrode 32, the resistance change element RC, an upper electrode 42, and the like.

The select transistor ST is provided on a surface of a semiconductor substrate (silicon substrate) 21. The select transistor ST is, for example, a metal oxide semiconductor field effect transistor (MOSFET). The select transistor ST has a buried gate structure in a surface area of the semiconductor substrate 21.

More specifically, the select transistor ST includes a gate insulating layer 22, a gate electrode 23, and two diffusion layers 25 (a drain diffusion layer and a source diffusion layer).

The gate insulating layer 22 is provided on an inner surface on the lower portion of a recess provided in the surface area of the semiconductor substrate 21. The gate electrode 23 is provided on an inner surface of the gate insulating layer 22 so as to fill the lower portion of the recess. This gate electrode 23 corresponds to the word line WL. An insulating layer 24 is provided on the gate insulating layer 22 and the gate electrode 23 so as to fill the upper portion of the recess. The insulating layer 24 is, for example, a silicon nitride layer that contains silicon nitride (SiN). An upper surface of the insulating layer 24 is at about the same height as an upper surface of the semiconductor substrate 21. The two diffusion layers 25 are provided in the surface area of the semiconductor substrate 21 so as to sandwich the gate insulating layer 22, the gate electrode 23, and the insulating layer 24.

It should be noted that the configuration of the select transistor ST is not limited to one having a buried gate structure. For example, a gate electrode may be formed on the surface of the semiconductor substrate 21 with a gate insulating film interposed therebetween. The select transistor ST may have any configuration as long as it functions as a switching element.

An insulating layer 31 is provided on the semiconductor substrate 21 (the insulating layer 24 and the diffusion layer 25). The insulating layer 31 is, for example, a silicon nitride layer that contains silicon nitride or a silicon oxide layer that contains silicon oxide ($SiO_2$).

The lower electrode 32 is provided in a contact hole of the insulating layer 31. The lower electrode 32 extends inside the insulating layer 31 in the stacking direction (vertical direction in FIG. 3). A lower end of the lower electrode 32 is connected to the diffusion layer 25 (drain). The lower electrode 32 is a metal layer including a metal and includes, for example, at least one of W, Ta, Ru, Ti, TaN, and TiN.

A buffer layer 33 is provided on a part of the lower electrode 32. The buffer layer 33 is a metal layer and includes, for example, at least one of Al, Be, Mg, Ca, Hf, Sr, Ba, Sc, Y, La, and Zr. The buffer layer 33 may also include at least one of compounds such as HfB, MgAlB, HfAlB, ScAlB, ScHfB, and HfMgB.

The resistance change element RC is provided on the buffer layer 33. The resistance change element RC includes a storage layer 34, a tunnel barrier layer 35, and a reference layer 36 in order from the buffer layer 33. The storage layer 34 is a ferromagnetic magnetization free layer and includes, for example, CoFeB, FeB, or MgFeO. The tunnel barrier layer 35 is a non-magnetic layer and includes, for example, MgO or AlO. The tunnel barrier layer 35 may also include a nitride of an element such as Al, Si, Be, Mg, Ca, Sr, Ba, Se, Y, La, Zr, or Hf. The reference layer 36 is a ferromagnetic magnetization fixed layer and includes, for example, CoFeB, FeB, or MgFeO. In other words, the resistance change element RC has a configuration in which the non-magnetic layer (tunnel barrier layer 35) is sandwiched between two ferromagnetic layers (the storage layer 34 and the reference layer 36).

A shift cancel layer 37 is provided on the resistance change element RC. The shift cancel layer 37 includes, for example, Co and at least one element selected from Pt, Ni, and Pd. A cap layer 38 is provided on the shift cancel layer 37. The cap layer 38 is a metal layer and includes, for example, at least one of Ta, Ru, Pt, and W. A hard mask 39, a metal layer, is provided on the cap layer 38.

An insulating layer 40 is provided on a side wall (side surface) of the MTJ element including the buffer layer 33, the resistance change element RC, the shift cancel layer 37, the cap layer 38, and the hard mask 39.

It should be noted that the buffer layer 33 is for accelerating crystallization of the layers formed thereon. When good crystal is obtained without the buffer layer 33, the buffer layer 33 may be omitted. Furthermore, the insulating layer 40 is a redeposition layer formed of an etched material that contains materials of the MTJ element and the lower electrode 32.

An insulating layer 41 is configured to cover the insulating layer 31 and the MTJ element. The insulating layer 41 is, for example, a silicon nitride layer or a silicon oxide layer.

The upper electrode 42 is provided in a contact hole of the insulating layer 41. The upper electrode 42 extends inside the insulating layer 41 in the stacking direction. A lower end of the upper electrode 42 is connected to the hard mask 39. The upper electrode 42 is a metal layer including a metal and includes, for example, at least one of W, Ta, Ru, Ti, TaN, and TiN.

A metal layer 43 is provided on the upper electrode 42. The metal layer 43 corresponds to the bit line BL and is connected to an upper end of the upper electrode 42.

Furthermore, a contact plug 44 is provided in the contact holes of the insulating layers 31 and 41. The contact plug 44 extends inside the insulating layers 31 and 41 in the stacking direction. A lower end of the contact plug 44 is connected to the diffusion layer 25 (source). An upper end of the contact plug 44 is connected to an unillustrated metal layer (source line SL).

FIG. 4A is a cross-sectional view of the resistance change element RC in the semiconductor memory device according to the embodiment.

As described above, the resistance change element RC includes a layer stack including the storage layer 34 which is the ferromagnetic layer, the reference layer 36 which is the ferromagnetic layer, and the tunnel barrier layer 35 which is the non-magnetic layer formed therebetween.

As illustrated in FIG. 4A, the storage layer 34 is a ferromagnetic layer whose magnetization direction is variable and has perpendicular magnetic anisotropy perpendicular or substantially perpendicular to the film surface (upper surface/lower surface). Herein, the expression "magnetization direction is variable" indicates that the magnetization direction changes with a predetermined write current. In addition, the term "substantially perpendicular" indicates that the direction of residual magnetization is within a range of $45°<\theta\leq90°$ relative to the film surface.

The reference layer 35 is a ferromagnetic layer whose magnetization direction is invariant and has perpendicular magnetic anisotropy perpendicular or substantially perpendicular to the film surface. Herein, the expression "magnetization direction is invariant" indicates that the magnetization direction does not change with a predetermined write current. In other words, switching energy barrier in the magnetization direction is larger in the reference layer 36 than the storage layer 34.

FIG. 4B is a cross-sectional view for explaining writing of the resistance change element RC in the semiconductor memory device according to the embodiment where the resistance change element RC is in a parallel state (P state). FIG. 4C is a cross-sectional view for explaining writing of the resistance change element RC in the semiconductor memory device according to the embodiment where the resistance change element RC is in an antiparallel state (AP state).

In this example, the resistance change element RC is, for example, a spin injection type resistance change element. Therefore, when data is written into the resistance change element RC or when data is read out from the resistance change element RC, a current flows in the resistance change element RC in one of the both directions perpendicular to the film surface.

More specifically, data is written into the resistance change element RC by the following manner.

As illustrated in FIG. 4B, when a current flows from the storage layer 34 to the reference layer 36, that is, when electrons are supplied from the reference layer 36 to the storage layer 34, electrons spin-polarized in the same direction as the magnetization direction of the reference layer 36 are injected into the storage layer 34, In this case, the magnetization direction of the storage layer 34 is aligned in the same direction as the magnetization direction of the reference layer 36. Accordingly, the magnetization direction of the reference layer 36 and that of the storage layer 34 are arranged in parallel. In this parallel state, the resistance of the resistance change element RC is the minimum. This state is defined, for example, as "0" data.

On the other hand, as illustrated in FIG. 4C, when a current flows from the reference layer 36 to the storage layer 34, that is, when electrons are supplied from the storage layer 34 to the reference 35, as the electrons are reflected by the reference layer 36, electrons spin-polarized in the direction opposite to the magnetization direction of the reference layer 36 are injected into the storage layer 34. In this case, the magnetization direction of the storage layer 34 is aligned in the direction opposite to the magnetization direction of the reference layer 35. Accordingly, the magnetization direction of the reference layer 36 and that of the storage layer 34 are arranged in antiparallel. In this antiparallel state, the resistance of the resistance change element RC is the maximum. This state is defined, for example, as "1" data.

The data from the resistance change element RC is read out by the following manner.

A read current is supplied to the resistance change element RC. This read current is set to a value which does not switch the magnetization direction of the storage layer 34 (a value smaller than the write current). By detecting the difference in resistance of the resistance change element RC at this time, the "0" data and the "1" data are read out.

Manufacturing Method According to Embodiment

FIGS. 5 to 13 are cross-sectional views illustrating a manufacturing process of the memory cell MC of the semiconductor memory device according to the embodiment.

Figure 5:
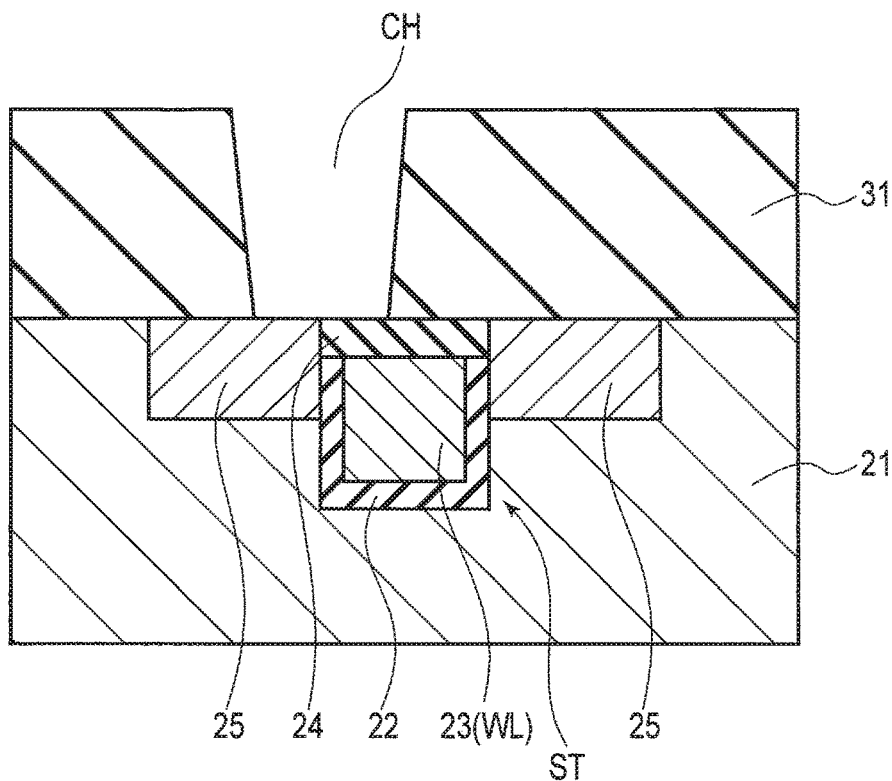
FIG. 5 is a cross-sectional view illustrating a manufacturing process of the memory cell of the semiconductor memory device according to the embodiment.

First, as illustrated in FIG. 5, the select transistor ST having the buried gate structure is formed in the surface area of the semiconductor substrate 21. The select transistor ST is formed in the following manner.

For example, after the recess is formed in the semiconductor substrate 21, the gate insulating layer 22 is formed on side surfaces and the bottom of the recess. The gate insulating layer 22 is, for example, a silicon oxide layer formed by thermal oxidation. Next, the gate electrode 23 including polysilicon is formed so as to fill the lower portion of the recess. Then, the insulating layer 24 which is a silicon nitride layer is formed so as to fill the upper portion of the recess, and the surface is planarized. Furthermore, the surface of the semiconductor substrate 21 is subjected to ion plantation of impurities so as to form the diffusion layer 25. In this manner, the select transistor ST is formed.

Next, the insulating layer 31 is formed on the semiconductor substrate 21, for example, by chemical vapor deposition (CVD). The insulating layer 31 is, for example, a silicon nitride layer or a silicon oxide layer. A contact hole CH extending in the stacking direction is formed in the insulating layer 31. The contact hole CH penetrates the insulating layer 31 and reaches the semiconductor substrate 21 (diffusion layer 25). Accordingly, the semiconductor substrate 21 (diffusion layer 25) is exposed at the bottom of the contact hole CH.

Figure 6:
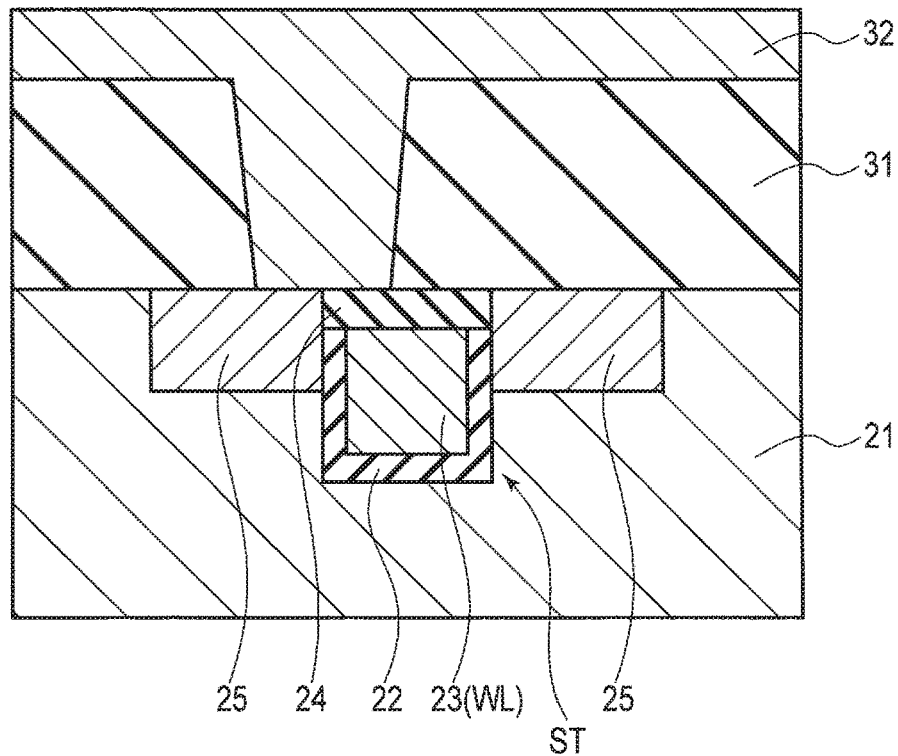
FIG. 6 is a cross-sectional view illustrating the manufacturing process of the memory cell of the semiconductor memory device according to the embodiment.

Next, as illustrated in FIG. 6, the lower electrode 32 is formed in the contact hole CH, for example, by CVD. Accordingly, the inside of the contact hole CH is filled. The lower end of the lower electrode 32 is connected to the diffusion layer 25. The lower electrode 32 is also formed on the insulating layer 31 outside the contact hole CH. The lower electrode 32 is a metal layer including a metal and includes, for example, sat least one of W, Ta, Ru, Ti, TaN, and TiN.

Figure 7:
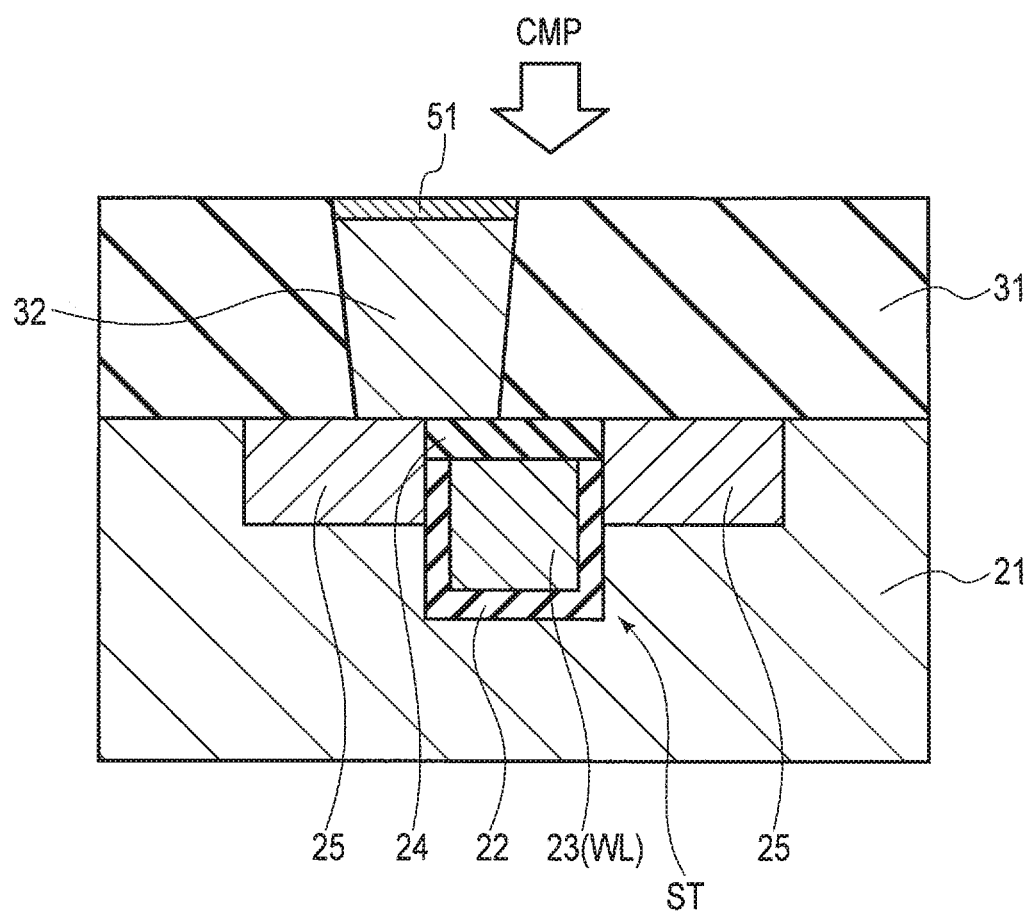
FIG. 7 is a cross-sectional view illustrating the manufacturing process of the memory cell of the semiconductor memory device according to the embodiment.

Next, as illustrated in FIG. 7, the lower electrode 32 formed outside the contact hole CH is removed, for example, by chemical mechanical polishing (CMP). Accordingly, a surface of the lower electrode 32 and a surface of the insulating layer 31 are planarized. At this time, the surface of the lower electrode 32 is oxidized by being exposed to the atmosphere, and the oxide layer 51 is formed on the surface of the lower electrode 32. The oxidation of the surface of the lower electrode 32 occurs, for example, during conveyance between manufacturing devices.

Figure 8:
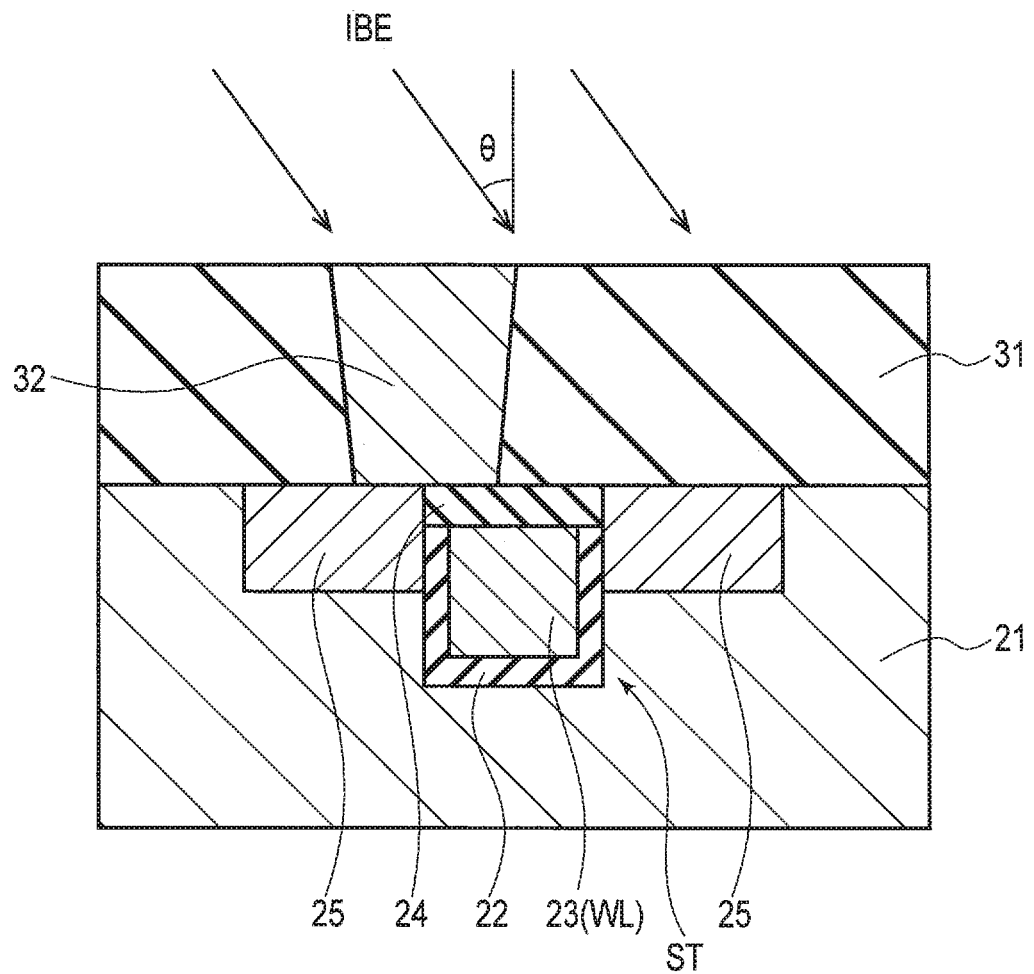
FIG. 8 is a cross-sectional view illustrating the manufacturing process of the memory cell of the semiconductor memory device according to the embodiment.

Next, as illustrated in FIG. 8, the surface of the lower electrode 32 (the oxide layer 51) and the surface of the insulating layer 31 are etched, for example, by ion beam etching (IBE). Accordingly, the oxide layer 51 of the lower electrode 32 is removed.

Herein, IBE is performed as an angle of ion beams is adjusted to θ. At the angle θ, an etching rate of the lower electrode 32 (oxide layer 51) and an etching rate of the insulating layer 31 become equivalent in IBE. Accordingly, the surface of the lower electrode 32 and the surface of the insulating layer 31 are etched while the surfaces are kept flat. Herein, θ is an angle when the direction perpendicular to the surface of the substrate (semiconductor substrate 21) (that is, in the stacking direction) is set as a reference (0 degree). Examples of inert gas used in IBE include Ar, Xe, Kr, and Ne. Details of the etching by THE will be described later with reference to FIG. 14.

Figure 9:
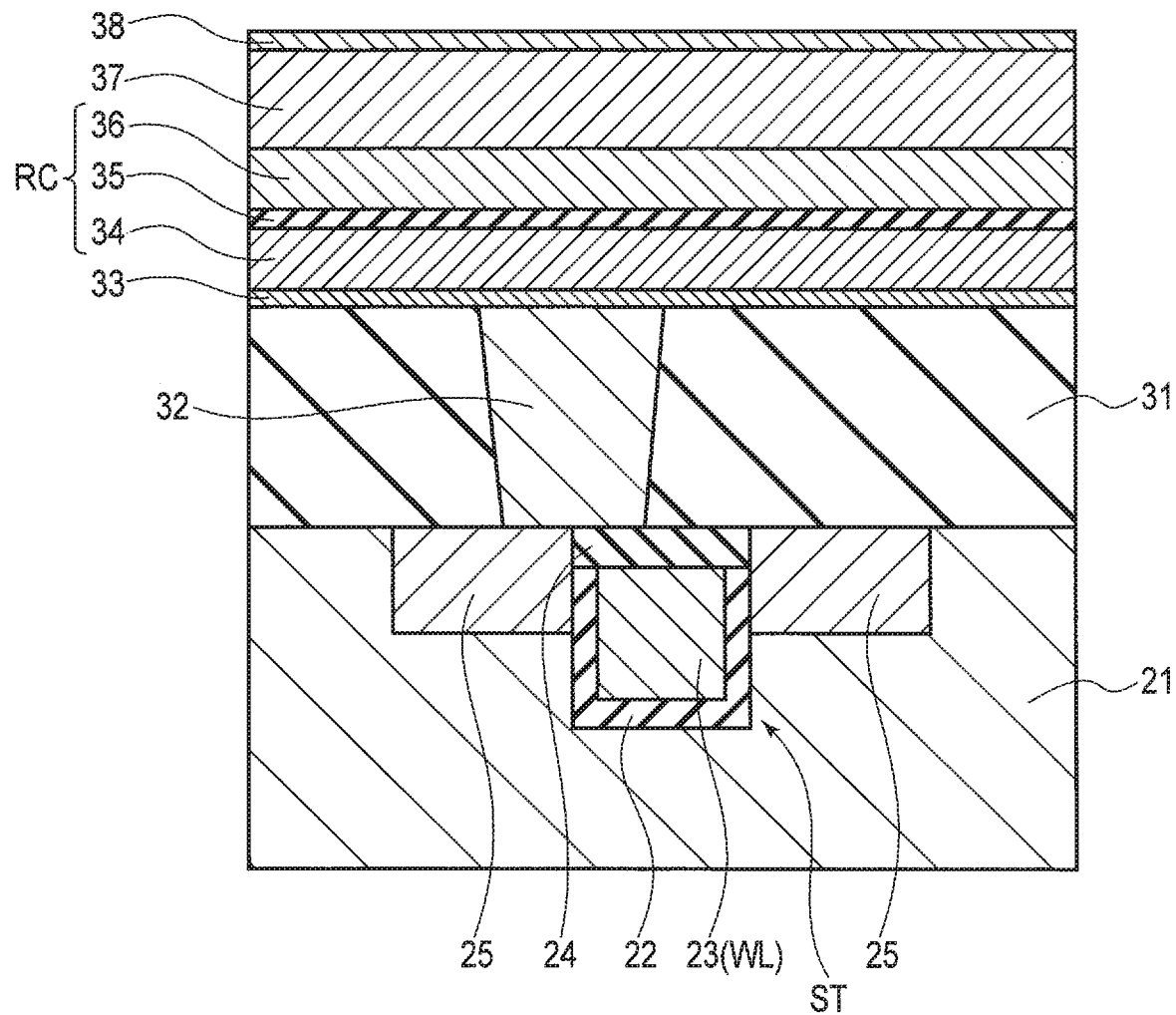
FIG. 9 is a cross-sectional view illustrating the manufacturing process of the memory cell of the semiconductor memory device according to the embodiment.

Next, as illustrated in FIG. 9, the buffer layer 33 is formed on the lower electrode 32 and the insulating layer 31, for example, by sputtering. The buffer layer 33 includes, for example, at least one of Al, Be, Mg, Ca, Hf, Sr, Ba, Sc, Y, La, and Zr. The buffer layer 33 may also include at least one of compounds such as HfB, MgAlB, HfAlB, ScAlB, SCHfB, and HfMgB.

Next, on the buffer layer 33, the storage layer 34, the tunnel barrier layer 35, and the reference layer 36 are formed in order, for example, by sputtering. The storage layer 34 and the reference layer 36 include, for example, CoFeB, FeB, or MgFeO. The tunnel barrier layer 35 contains, for example, MgO or AlO. The tunnel barrier layer 35 may also include a nitride of an element such as Al, Si, Be, Mg, Ca, Sr, Ba, Sc, Y, La, Zr, or Hf.

Next, the shift cancel layer 37 is formed on the reference layer 36, for example, by sputtering. The shift cancel layer 37 includes, for example, Co and at least one element selected from Pt, Ni, and Pd. The cap layer 38 is formed on the shift cancel layer 37, for example, by sputtering. The cap layer 38 includes, for example, at least one of Ta, Ru, Pt, and W.

Figure 10:
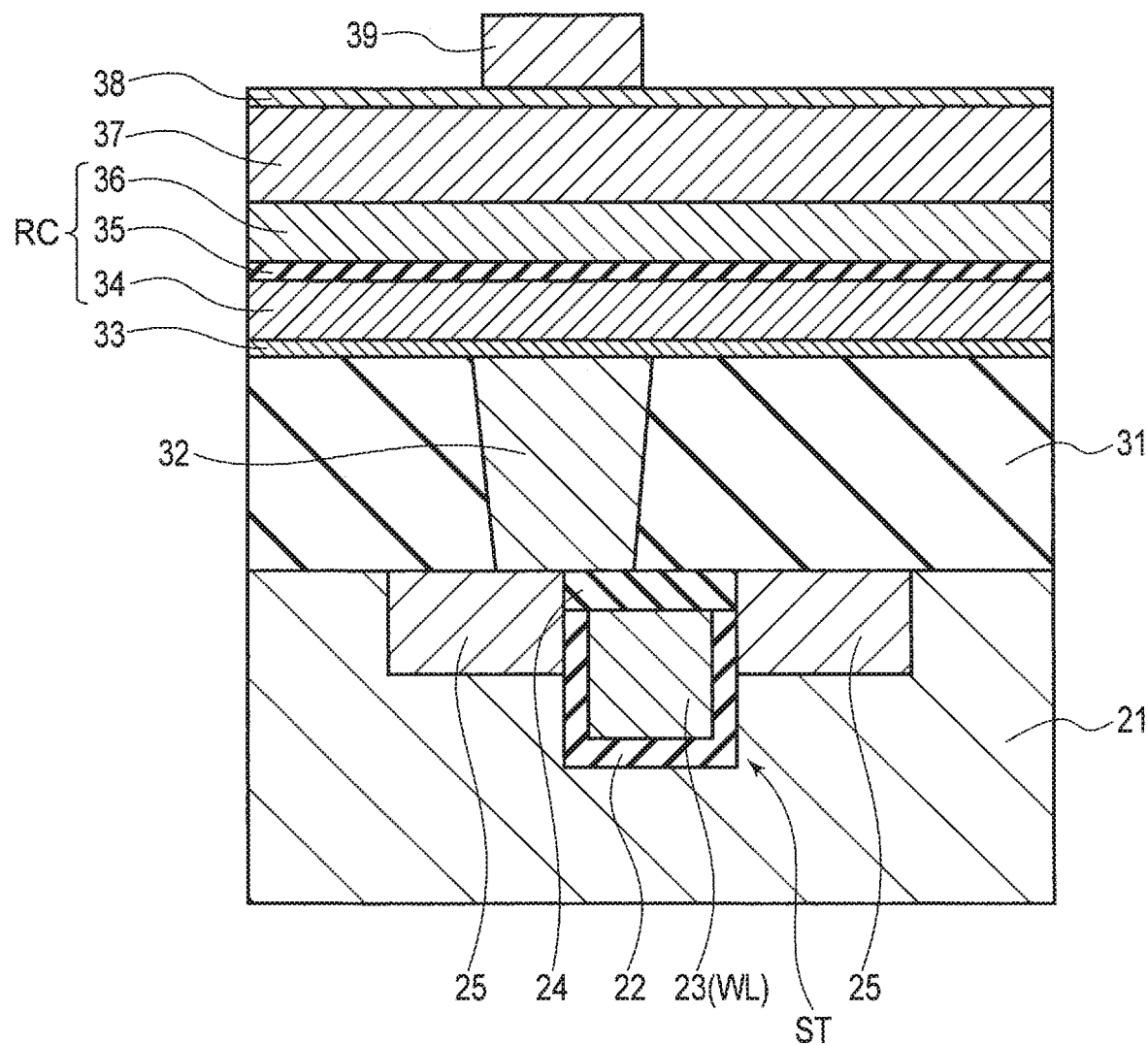
FIG. 10 is a cross-sectional view illustrating the manufacturing process of the memory cell of the semiconductor memory device according to the embodiment.

Next, as illustrated in FIG. 10, the hard mask 39 is formed on the cap layer 38. The hard mask 39 is patterned so as to correspond to a pattern of the MTJ element. In other words, the hard mask 39 is formed so as to correspond to an area above the lower electrode 32. The hard mask 39 is a metal layer.

Figure 11:
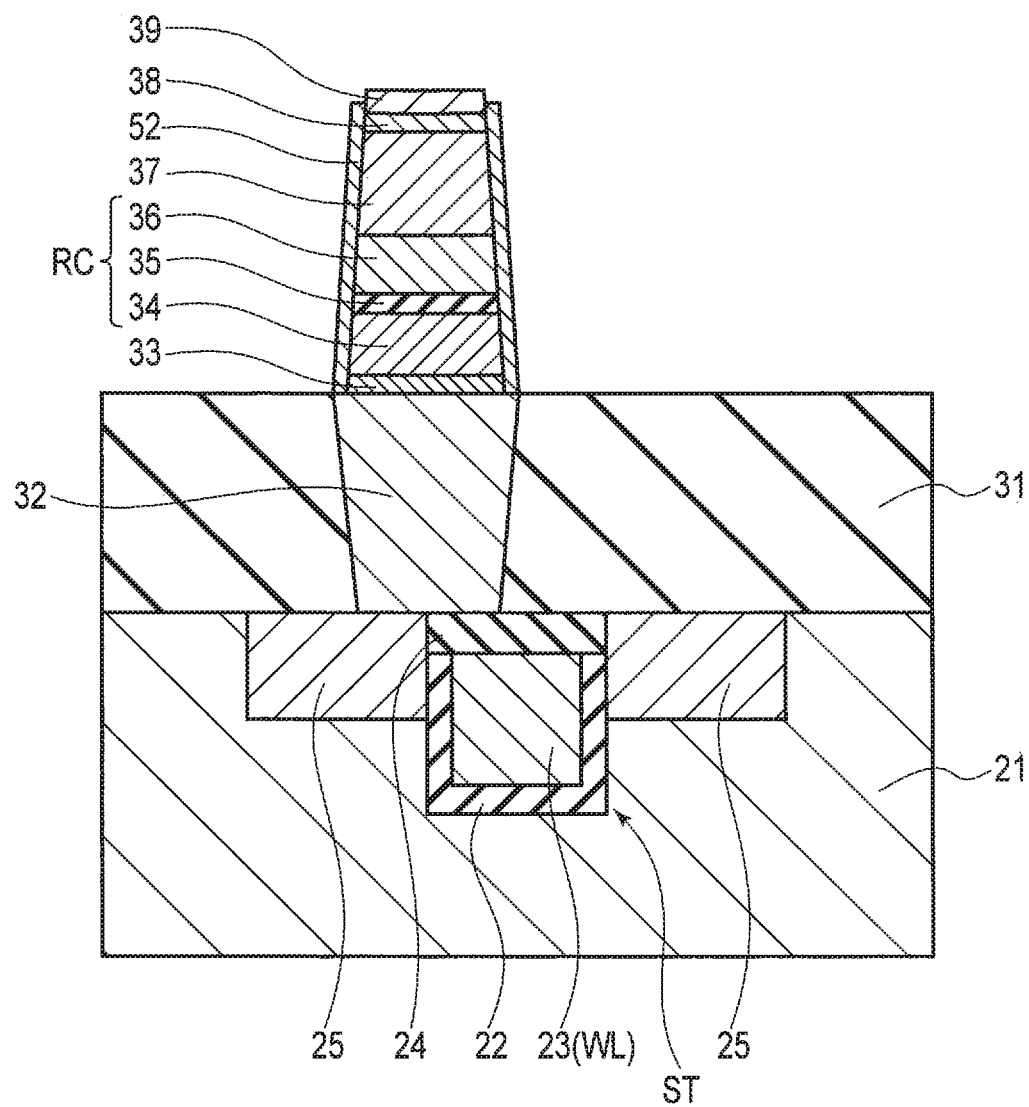
FIG. 11 is a crops-sectional view illustrating the manufacturing process of the memory cell of the semiconductor memory device according to the embodiment.

Next, as illustrated in FIG. 11, a range from the cap layer 38 to the buffer layer 33 is etched by, for example, IBE using the hard mask 39. This etching reaches the lower electrode 32 and the insulating layer 31. Accordingly, the MTJ element is formed. Herein, the hard mask 39 remains partially but may be removed thoroughly.

Simultaneously to the etching of the MTJ element, a sidewall layer 52 which is a redeposition layer from layers of the MTJ element is formed on the side wall of the MTJ element. At this time, in order to completely form the MTJ element, over etching is performed to the layer deeper than the buffer layer 33. In other words, a part of the lower electrode 32 is also etched. Therefore, the sidewall layer 52 is a red position layer formed of the etched material containing the materials of the MTJ element and the lower electrode 32.

Figure 12:
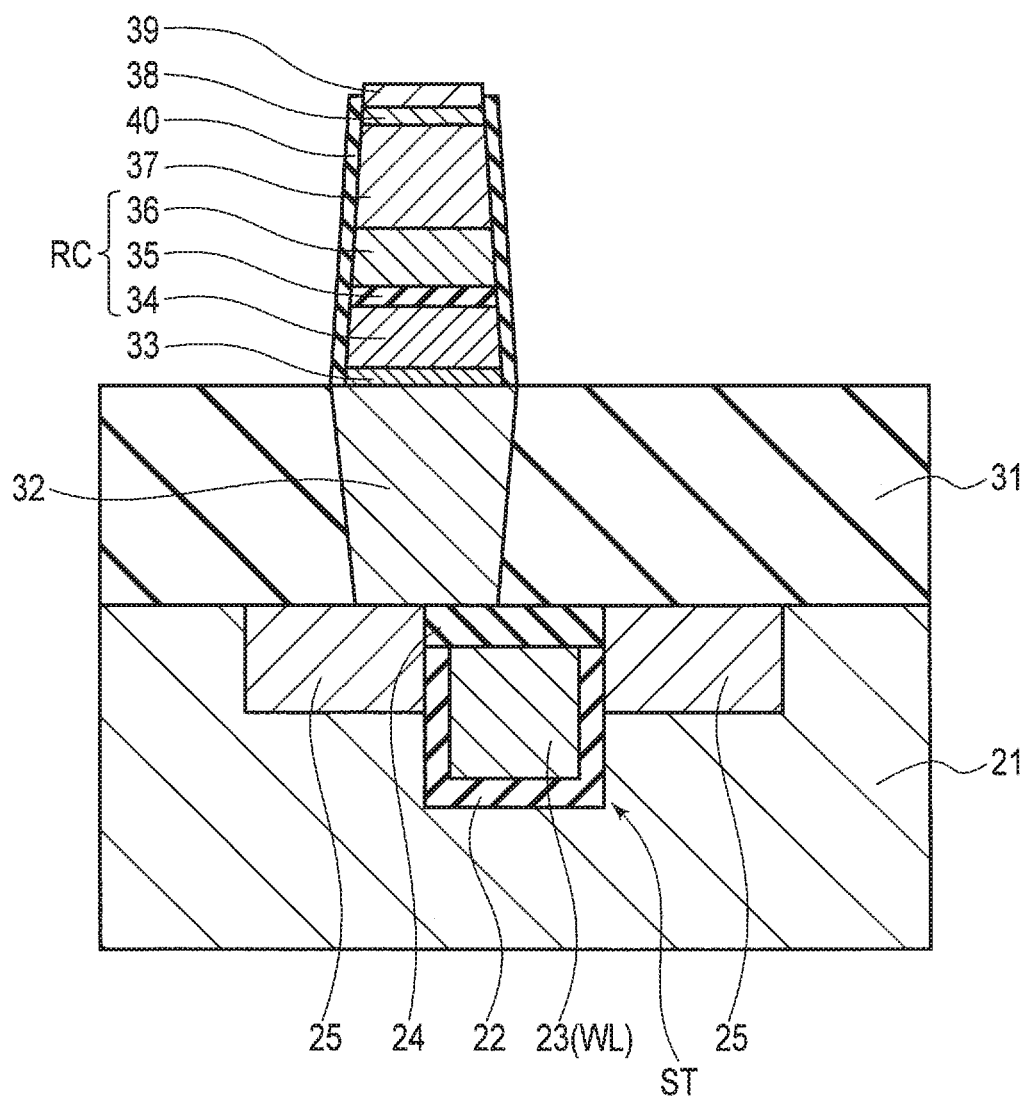
FIG. 12 is a cross-sectional view illustrating the manufacturing process of the memory cell of the semiconductor memory device according to the embodiment.

Next, as illustrated in FIG. 12, the sidewall layer 52 is oxidized, turning into the insulating layer 40. The insulating layer 40 is an oxide. This prevents electrical short circuit between the storage layer 34 and the reference layer 36 due to the sidewall layer 52.

Next, as illustrated in FIG. 13, a protective insulating layer 53 is formed so as to cover the MTJ element. The protective insulating layer 53 is a nitride layer such as a silicon nitride layer, an aluminum nitride layer, or a hafnium nitride layer. The protective insulating layer 53 may not be formed. FIG. 3 illustrates an example without the protective insulating layer 53.

Then, as illustrated in FIG. 3, the insulating layer 41 is formed on the entire surface, for example, by CVD. The insulating layer 41 is, for example, a silicon nitride layer or a silicon oxide layer. A contact hole penetrating into the hard mask 39 and a contact hole penetrating into the diffusion layer 25 are formed in the insulating layer 41. A metal layer is formed in these contact holes so that the upper electrode 42 and the contact plug 44 are formed. Furthermore, the metal layer 43, which is to be the bit line BL, is formed on the upper electrode 42. In addition, the source line SL is formed on the contact plug 44.

In this manner, the semiconductor memory device according to the embodiment is formed.

[Etching by IBE]

Figure 14:
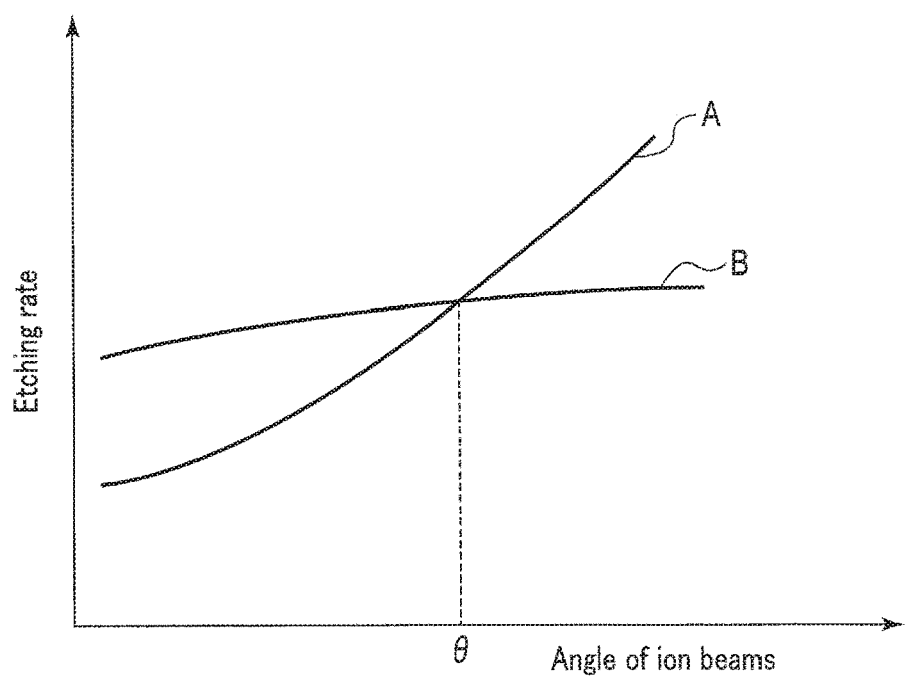
FIG. 14 is a view illustrating a relationship between an angle of ion beams and an etching rate in BE.

FIG. 14 is a view illustrating a relationship between an angle of the ion beams and an etching rate in IBE. Herein, the solid line A indicates insulators such as silicon nitride and silicon oxide, and the solid line B indicates metals such as W, Ta, Ru, Ti, TaN, and TiN. In other words, the solid line A represents the insulating layer 31, and the solid line B represents the lower electrode 32, Therefore, FIG. 14 illustrates data for etching the insulating layer 31 and the lower electrode 32 by IBE.

As illustrated in FIG. 14, in IBE, an etching rate of the to-be-etched material can be controlled by adjusting the angle of the ion beams. For example, both the etching rate of the insulating layer 31 and the etching rate of the lower electrode 32 increase (monotonically increase) as the angle of the ion beams increases. Herein, the gradient of the solid line A is larger than the gradient of the solid line B. In other words, when the angle of the ion beams increases, the growth rate in the etching rate of the insulating layer 31 is larger than the growth rate in the etching rate of the lower electrode 32.

As illustrated in the drawing, when the angle of the ion beams is small ($<\theta$), the etching rate of the insulating layer 31 is smaller than the etching rate of the lower electrode 32. When the angle of the ion beams becomes larger and reaches $\theta$, the etching rate of the insulating layer 31 becomes equal to the etching rate of the lower electrode 32. Furthermore, as the angle of the ion beam increases ($>\theta$), the etching rate of the insulating layer 31 is higher than the etching rate of the lower electrode 32.

In this manner, the change rate in the etching rate of the insulating layer 31 and the change rate in the etching rate of the lower electrode 32 are different, relative to the angle of the ion beams in IBE. At the angle $\theta$, of the ion beams, the etching rate of the insulating layer 31 and the etching rate of the lower electrode 32 become equivalent. In the embodiment, IBE is performed at this angle $\theta$ of the ion beams as illustrated in FIG. 8.

Effect of Embodiment

Figure 15:
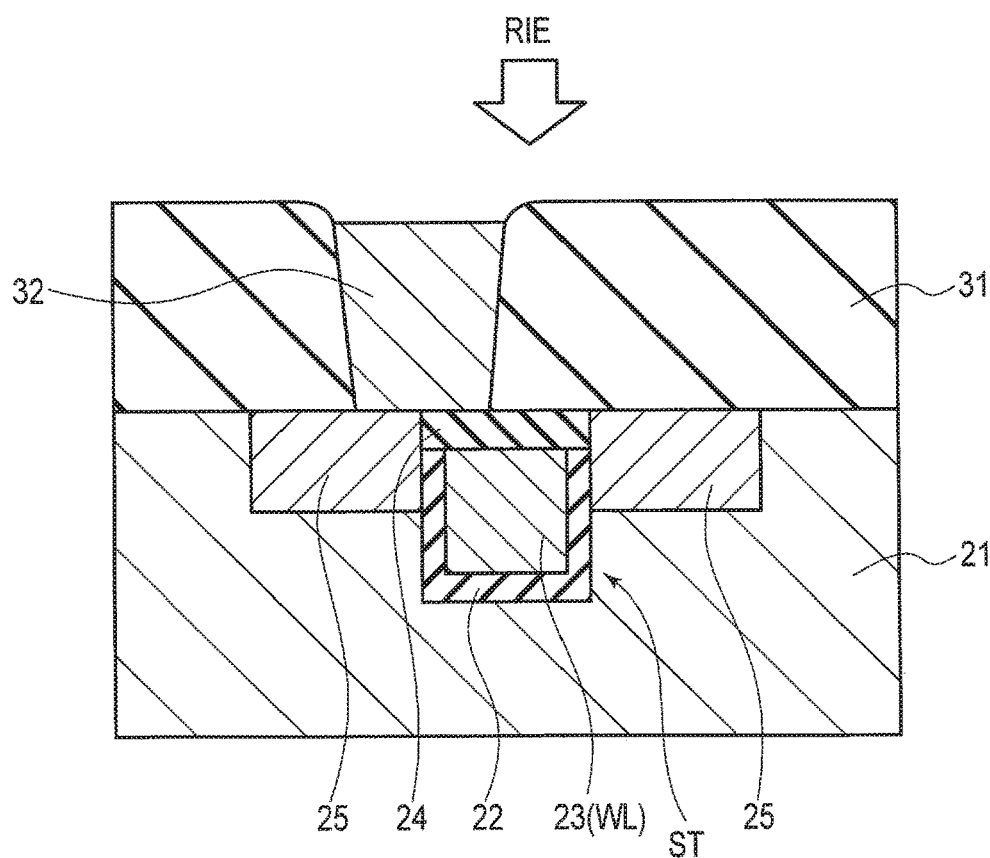
FIG. 15 is a cross-sectional view illustrating a comparative example of the manufacturing process of the memory cell of the semiconductor memory device according to the embodiment.

FIG. 15 is a cross-sectional view illustrating a comparative example of the manufacturing process of the memory cell MC of the semiconductor memory device according to the embodiment.

As illustrated in FIG. 15, in the comparative example, reactive ion etching (RIE) is performed in order to remove the oxide layer 51 on the surface of the lower electrode 32. Accordingly, the surface of the lower electrode 32 (the oxide layer 51) and the surface of the insulating layer 31 are etched. However, in RIE, the etching rate of the lower electrode 32 is different from the etching rate of the insulating layer 31. In RIE, the angle of the ion beams cannot be adjusted in the manner as in IBE, and the etching rate cannot be controlled by adjusting the angle of the ion beam. In other words, it is difficult to adjust the etching rate of the lower electrode 32 to be equivalent to the etching rate of the insulating layer 31. Therefore, for example, the etching rate of the lower electrode 32 is larger than the etching rate of the insulating layer 31, and the lower electrode 32 is etched more than the insulating layer 31. Accordingly, irregularities are formed on the surface of the insulating layer 31 and the surface of the lower electrode 32. Thus, the MTJ element is unstably formed on the insulating layer 31 and the lower electrode 32, which may cause characteristic degradation of the memory cell.

On the other hand, according to the above embodiment, IBE is performed to remove the oxide layer 51 on the surface of the lower electrode 32. In IBE, the etching rate of the to-be-etched material is controlled by adjusting the angle of the ion beams. In this example, the angle of the ion beams in TEE is set to such that the etching rate of the lower electrode 32 and the etching rate of the insulating layer 31 become equivalent. Accordingly, it is possible to perform etching while maintaining flatness of the surface of the insulating layer 31 and the surface of the lower electrode 32, which suppresses irregularities on the surfaces. Thus, it is possible to stably form the MTJ element on the insulating layer 31 and the lower electrode 32, which suppresses characteristic degradation of the memory cell.

In the embodiment, the memory cell MC illustrated in FIG. 3 is described, but the following modification is also applicable.

Figure 16:
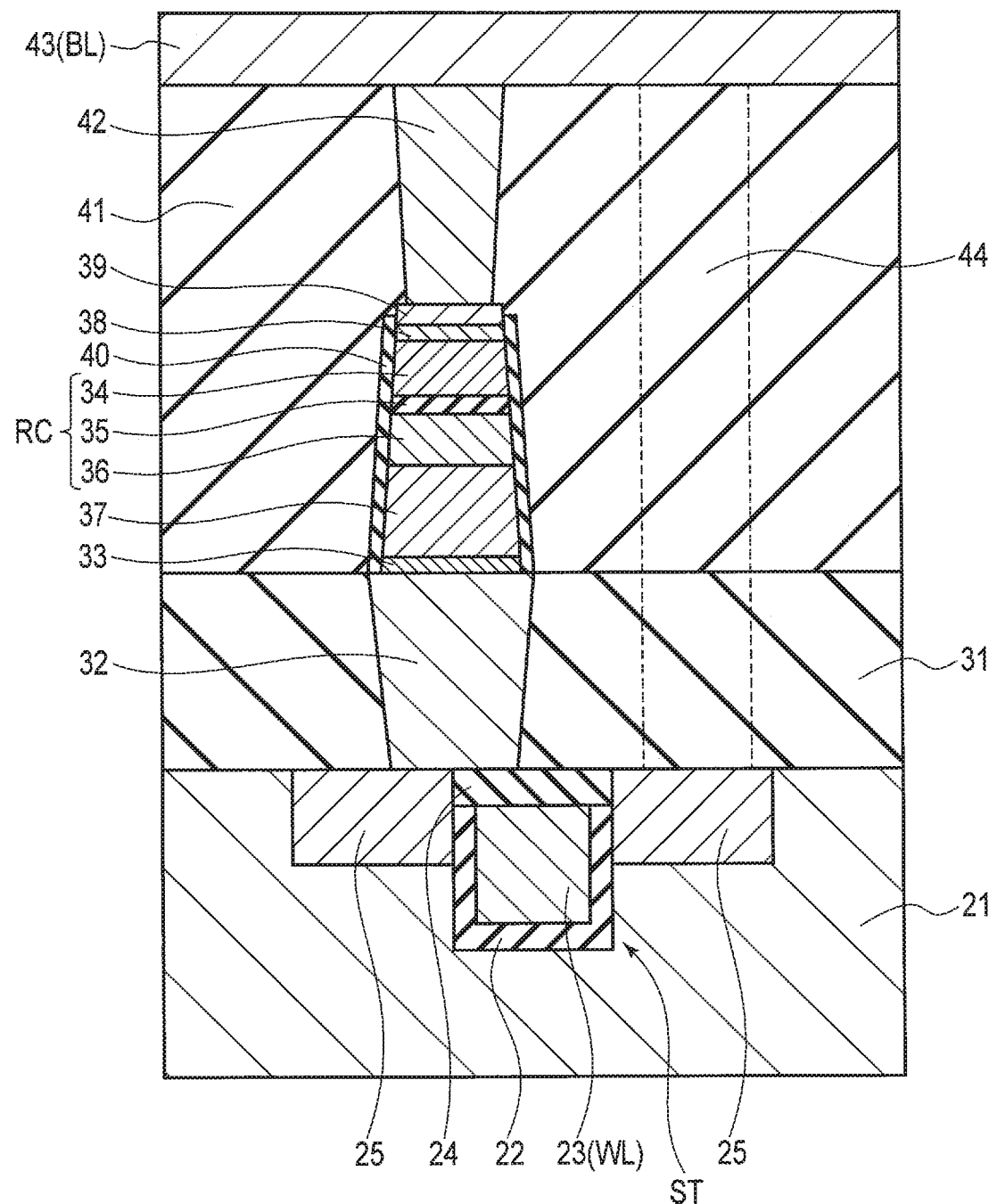
FIG. 16 is a cross-sectional view illustrating a modification of the memory cell illustrated in FIG. 3.

FIG. 16 is a cross-sectional view illustrating a modification of the memory cell MC illustrated in FIG. 3.

In FIG. 3, the storage layer 34, the tunnel barrier layer 35, and the reference layer 36 are provided in the MTJ element in order from the lower side. In contrast, as illustrated in FIG. 16, the storage layer 34 and the reference layer 36 may be disposed in reverse. In this case, the shift cancel layer 37 may also be disposed in a different layer. In other words, in the MTJ element, the shift cancel layer 37, the reference layer 36, the tunnel barrier layer 35, and the storage layer 34 are provided in order from the lower side.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, the method comprising:
    forming an insulating layer on a substrate;
    forming a hole in the insulating layer;
    forming a metal layer in the hole to fill the hole;
    removing a surface of the insulating layer and a surface of the metal layer by etching with ion beams having a first angle, both the insulating layer and the metal layer being etched at a first etching rate with the ion beams of the first angle; and
    forming a resistance change element on the metal layer, wherein the removing of the surface of the insulating layer and the surface of the metal layer forms a coplanar surface over the insulating layer and the metal layer in the hole.

2. A method of manufacturing a semiconductor memory device, the method comprising:
- forming an insulating layer on a substrate;
- forming a hole in the insulating layer;
- forming a metal layer in the hole to fill the hole;
- removing a surface of the insulating layer and a surface of the metal layer by etching with ion beams having a first angle, both the insulating layer and the metal layer being etched at a first etching rate with the ion beams of the first angle; and
- forming a resistance change element on the metal layer,
- wherein the removing of the surface of the metal layer includes removing an oxide of a metal on a top surface of the metal layer in the hole.

3. A method of manufacturing a semiconductor memory device, the method comprising:
- forming an insulating layer on a substrate;
- forming a hole in the insulating layer;
- forming a metal layer in the hole to fill the hole;
- removing a part of the metal layer on the insulating layer;
- removing a surface of the insulating layer and a surface of the metal layer by etching with ion beams having a first angle after the removing of the part of the metal layer on the insulating layer, wherein both the insulating layer and the metal layer are etched at a first etching rate with the ion beams of the first angle, and wherein the removing of the surface of the metal layer includes removing an oxide of a metal on a top surface of the metal layer in the hole; and
- forming a resistance change element on the metal layer.

4. The method according to claim 3, wherein:
- the removing of the surface of the insulating layer and the surface of the metal layer comprises exposing a first surface of the metal layer, and
- the forming of the resistance change element on the metal layer comprises forming the resistance change element on the first surface of the metal layer.

5. The method according to claim 4, wherein the forming of the metal layer in the hole comprises forming the metal layer in the hole to close an opening of the hole.

6. The method according to claim 4, wherein the removing of the surface of the insulating layer and the surface of the metal layer forms a continuous surface over the insulating layer and the metal layer in the hole.

* * * * *

UNITED STATES PATENT AND TRADEMARK OFFICE
CERTIFICATE OF CORRECTION

PATENT NO. : 10,593,872 B2
APPLICATION NO. : 16/123235
DATED : March 17, 2020
INVENTOR(S) : Sonoda et al.

Page 1 of 1

It is certified that error appears in the above-identified patent and that said Letters Patent is hereby corrected as shown below:

On the Title Page

Item (73), after "TOSHIBA MEMORY CORPORATION, TOKYO (JP)" insert --; SK HYNIX INC. ICHEON-SI GYEONGGI-DO (KR)--.

Signed and Sealed this
Twenty-second Day of December, 2020

Andrei Iancu
*Director of the United States Patent and Trademark Office*